(12) United States Patent
Zou et al.

(10) Patent No.: US 11,632,620 B1
(45) Date of Patent: Apr. 18, 2023

(54) HEADPHONE AND ELECTRONIC DEVICE

(71) Applicant: SENODIA TECHNOLOGIES (SHAOXING) CO., LTD., Shaoxing (CN)

(72) Inventors: Bo Zou, Shaoxing (CN); Yan Huang, Shaoxing (CN); Shuang Liu, Shaoxing (CN)

(73) Assignee: SENODIA TECHNOLOGIES (SHAOXING) CO., LTD., Shaoxing (CN)

( * ) Notice: Subject to any disclaimer, the term of this patent is extended or adjusted under 35 U.S.C. 154(b) by 0 days.

(21) Appl. No.: 17/802,530

(22) PCT Filed: Feb. 25, 2021

(86) PCT No.: PCT/CN2021/077918
§ 371 (c)(1),
(2) Date: Aug. 26, 2022

(87) PCT Pub. No.: WO2021/170041
PCT Pub. Date: Sep. 2, 2021

(30) Foreign Application Priority Data

Feb. 27, 2020 (CN) .......................... 202010122942.2

(51) Int. Cl.
*H04R 25/00* (2006.01)
*H04R 1/10* (2006.01)
(Continued)

(52) U.S. Cl.
CPC .............. *H04R 1/1083* (2013.01); *B81B 7/02* (2013.01); *G10K 11/17825* (2018.01);
(Continued)

(58) Field of Classification Search
CPC ................ H04R 1/1083; H04R 1/1091; G10K 11/17825; B81B 7/02
See application file for complete search history.

(56) References Cited

U.S. PATENT DOCUMENTS 10,512,750 B1   12/2019  Lewin Jessen et al.
2008/0282833 A1*  11/2008  Chaumet ............ G01C 19/5762
                                                            74/5 R
(Continued)

FOREIGN PATENT DOCUMENTS

CN       102611957 A    7/2012
CN       104604249 A    5/2015
(Continued)

*Primary Examiner* — Simon King
(74) *Attorney, Agent, or Firm* — Bayramoglu Law Offices LLC

(57) ABSTRACT

A headphone and an electronic device are provided. The headphone includes a gyroscope, which senses a bone conduction vibration and provides a quadrature error signal for reflecting the bone conduction vibration. Specifically, the headphone includes a transmission assembly that acts directly or indirectly on the gyroscope or an inertial measurement unit (IMU) including the gyroscope. The transmission assembly transmits the bone conduction vibration to the gyroscope to make the gyroscope strain, thereby causing the quadrature error signal of the gyroscope to change to detect the bone conduction vibration with sensitivity.

15 Claims, 6 Drawing Sheets

(51) Int. Cl.
*H04R 1/46* (2006.01)
*B81B 7/02* (2006.01)
*G10K 11/178* (2006.01)
*H04R 3/00* (2006.01)

(52) U.S. Cl.
CPC ............ *H04R 1/1091* (2013.01); *H04R 1/46* (2013.01); *H04R 3/00* (2013.01); *B81B 2201/0242* (2013.01); *H04R 2460/13* (2013.01)

(56) References Cited

U.S. PATENT DOCUMENTS

| | | | |
|---|---|---|---|
| 2015/0377625 A1 | 12/2015 | Aaltonen | |
| 2019/0174237 A1* | 6/2019 | Lunner | H04R 1/1041 |
| 2020/0261009 A1* | 8/2020 | Everman | G01L 9/00 |
| 2022/0011113 A1* | 1/2022 | Harrison | G01C 21/18 |

FOREIGN PATENT DOCUMENTS

| | | |
|---|---|---|
| CN | 205456827 U | 8/2016 |
| CN | 107071647 A | 8/2017 |
| CN | 107148774 A | 9/2017 |
| CN | 108253953 A | 7/2018 |
| CN | 108692836 A | 10/2018 |
| CN | 109506639 A | 3/2019 |
| CN | 109987569 A | 7/2019 |
| CN | 111246336 A | 6/2020 |
| JP | 2010025733 A | 2/2010 |

* cited by examiner

HEADPHONE AND ELECTRONIC DEVICE

CROSS REFERENCE TO THE RELATED APPLICATIONS

This application is the national phase entry of International Application No. PCT/CN2021/077918, filed on Feb. 25, 2021, which is based upon and claims priority to Chinese Patent Application No. 202010122942.2, filed on Feb. 27, 2020, the entire contents of which are incorporated herein by reference.

TECHNICAL FIELD

The present disclosure relates to the field of microelectromechanical systems (MEMS), and in particular to a headphone and an electronic device.

BACKGROUND

The voice recognition system and voice communication system usually use an acoustic microphone to sense sound waves generated by the user when the user is speaking to obtain the user's voice. With the maturity and wide-scale application of Internet technology and the popularization of Internet of Things (IoT) products, the requirements for voice processing are getting higher.

In the process of voice recognition and voice communication, the noise caused by the user's surroundings or the user is an important problem to be addressed in voice processing.

For some currently known headphone products, especially earbuds, their usage status is determined by sensing the wearer's bone conduction vibration, thereby improving the voice processing effect, such as improving voice intelligibility and reducing voice recognition error rate.

Those skilled in the art are also devoted to the exploration of the acquisition method of bone conduction vibration and the use of the acquired signal.

SUMMARY

In view of this, an objective of the present disclosure is to provide a headphone, including a gyroscope, which senses a bone conduction vibration and provides a quadrature error signal for reflecting the bone conduction vibration.

Further, the headphone may include a transmission assembly that may act directly or indirectly on the gyroscope or an inertial measurement unit (IMU) including the gyroscope. The transmission assembly transmits the bone conduction vibration to the gyroscope to make the gyroscope strain, thereby causing the quadrature error signal of the gyroscope to change.

Further, the transmission assembly has at least one end fixed to the shell of the headphone and at least one end connected to, abutting against, or spaced a certain distance from the gyroscope or the IMU including the gyroscope.

Further, the transmission assembly has a symmetrical structure.

Further, the transmission assembly may include a first transmission component and a second transmission component, which may be respectively arranged on two sides of the gyroscope. The first transmission component has one end fixed to a shell of the headphone and the other end connected to, abutting against, or spaced a certain distance from the gyroscope or the IMU including the gyroscope. The second transmission component has one end fixed to the shell of the headphone and the other end connected to, abutting against, or spaced a certain distance from the gyroscope or the IMU including the gyroscope.

Further, the transmission assembly may include a first end, a second end, and a third end. The first end and the second end may be separately fixed to the shell of the headphone, and the third end may be connected to, abuts against, or may be spaced a certain distance from the gyroscope or the IMU including the gyroscope.

Further, the transmission assembly may be made of a rigid material or may be made of an elastic material suitable for transmitting the bone conduction vibration to the gyroscope or the IMU including the gyroscope and making the gyroscope strain.

Further, the gyroscope or the IMU including the gyroscope may be fixed to a base plate. The transmission assembly may directly act on the base plate, thereby indirectly acting on the gyroscope or the IMU including the gyroscope through the base plate.

Further, a connection position of the transmission assembly and the shell of the headphone may define a sensing zone, which may be located at a position suitable for sensing the bone conduction vibration when the headphone may be worn.

The present disclosure further provides an electronic device including the above headphone.

Further, the quadrature error signal of the gyroscope may be used for user interface (UI) gesture detection, voice activity detection, voice recognition, active noise control, noise suppression, and voice intelligibility enhancement.

The headphone of the present disclosure has the following technical effects.

1. The existing sensing element in the headphone is combined with a simple and easy-to-implement mechanical structure to realize bone conduction vibration sensing.

2. The quadrature error signal of the gyroscope changes greatly when strain is generated, thereby improving the sensitivity of bone conduction vibration detection.

3. The present disclosure only needs to add the transmission assembly to the existing product to realize bone conduction vibration sensing. Compared with the prior art, the present disclosure reduces the number of electronic components used and achieves the same function, thereby greatly reducing the implementation cost of the overall solution and is easy to popularize.

To make the objectives, features, and effects of the present disclosure fully understood, the concepts, specific structures, and technical effects of the present disclosure are clearly and completely described below in conjunction with the examples and drawings.

DETAILED DESCRIPTION OF THE EMBODIMENTS

Figure 1:
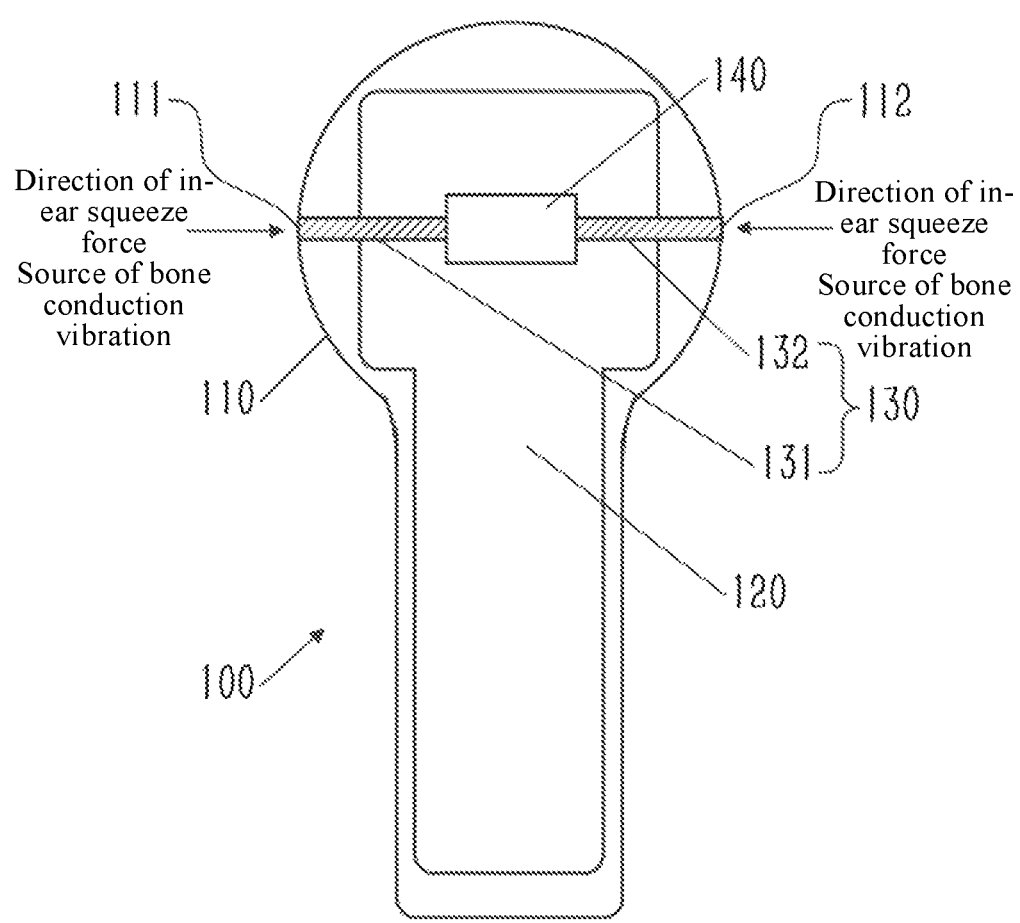
FIG. 1 is an internal structural diagram of a headphone according to an embodiment of the present disclosure.

It should be understood that, in the description of the present disclosure, the orientation or position relationships indicated by terms, such as "upper", "lower", "front", "rear", "left", "right", "vertical", "horizontal", "top", "bottom", "inside", "outside", "clockwise", and "counterclockwise", are based on what are illustrated in the drawings. These terms are merely intended to facilitate and simplify the description of the present disclosure, rather than to indicate or imply that the mentioned device or components must have a specific orientation or must be constructed and operated in a specific orientation. Therefore, these terms should not be understood as a limitation to the present disclosure. The drawings are schematic diagrams or conceptual diagrams, in which the relationship between the thickness and width of each part and the proportional relationship between each part are not completely consistent with the actual value.

Figure 2:
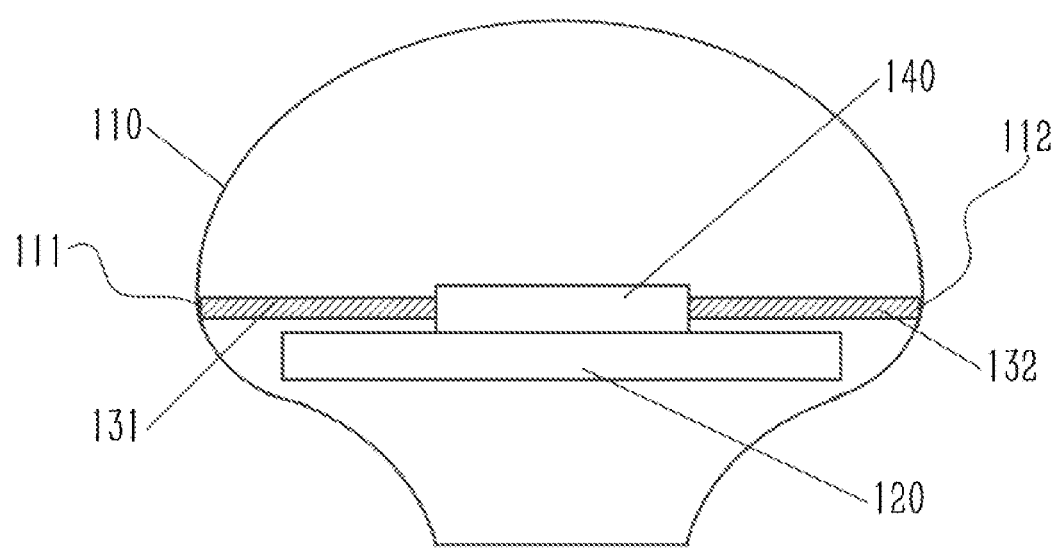
FIG. 2 is an internal structural diagram of the headphone shown in FIG. 1 in a top view.

FIGS. 1 and 2 are schematic diagrams according to an embodiment of the present disclosure. A headphone 100 includes a shell 110, a printed circuit board (PCB) 120, a transmission assembly 130, and a gyroscope 140.

The PCB 120 is fixedly provided in the shell 110, and the gyroscope 140 is fixed on the PCB 120. The transmission assembly 130 includes transmission bars 131 and 132. The transmission bars 131 and 132 are made of the same material and have the same structure.

In this embodiment, the gyroscope 140 is provided in the shell 110 and close to an upper part of the headphone 100. The transmission bars 131 and 132 are symmetrically arranged on two sides of the gyroscope 140. The transmission bar 131 has one end fixed to one inner side of the shell 110 and the other end connected to the gyroscope 140. The transmission bar 132 has one end symmetrical with the one end of the transmission bar 131 and fixed to the other inner side of the shell 110 and the other end connected to the gyroscope 140.

In this embodiment, the transmission bars 131 and 132 are fixedly connected to the gyroscope 140 by welding. They may also be fixedly connected by other means, such as gluing, etc., which are not limited herein.

The connection of the transmission bars 131 and 132 to the shell 110 defines sensing positions 111 and 112. The sensing positions 111 and 112 must satisfy the following condition. When the headphone 100 is worn, the sensing positions 111 and 112 are located within the wearer's ear canal in contact with the wall of the ear canal, and the contact positions are adapted to receive bone conduction vibrations generated by the wearer's speech. The bone conduction vibrations are generated by the movement of the bones and soft tissues of the head and face of the wearer when the wearer speaks. The bone conduction vibrations are transmitted to the wall of the ear canal. The sensing positions 111 and 112 should be suitable for sensing bone conduction vibrations.

When the wearer is speaking, bone conduction vibrations on the wall of the ear canal act on the sensing positions 111 and 112. In other words, the stress states at the sensing positions 111 and 112 are constantly changing with the vibrations. The bone conduction vibrations sensed by the sensing positions 111 and 112 are transmitted to the gyroscope 140 through the transmission bars 131 and 132, respectively, such that the stress state of the gyroscope 140 changes continuously with the vibrations. If the gyroscope 140 is strained under a stress, the strain state also changes continuously with the vibration. This strain can be sensitively detected by the gyroscope 140.

Figure 3:
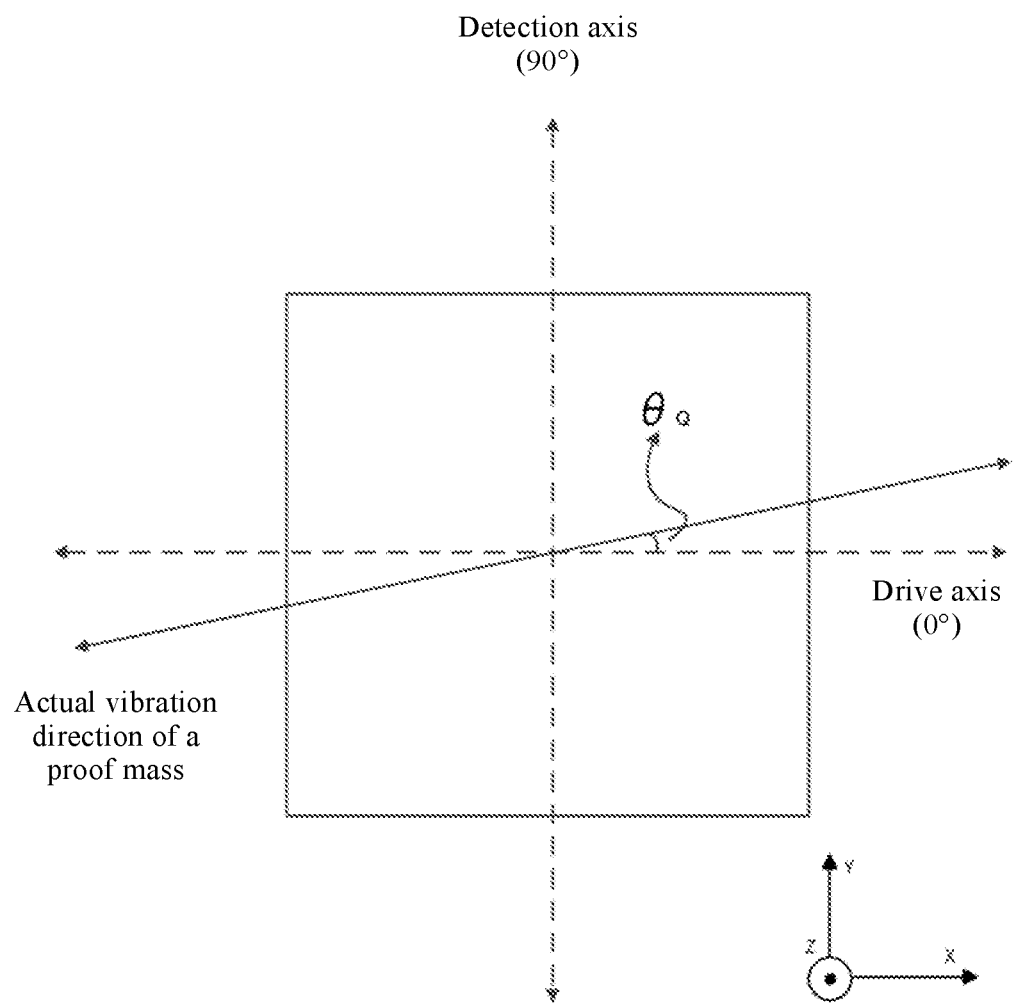
FIG. 3 is a schematic diagram of the quadrature coupling of an existing gyroscope.

FIG. 3 is a schematic diagram of quadrature coupling of a capacitive micro-electromechanical-system (MEMS) gyroscope. The capacitive MEMS gyroscope is a micromachined device. It mainly relies on a Coriolis force to detect an angular velocity signal and has two working modes, namely a drive mode and a detection mode. Ideally, when a drive end of the gyroscope applies an eigenfrequency electrical signal in the drive mode, a proof mass of the gyroscope will vibrate back and forth at an eigenfrequency on a drive axis (X-axis in FIG. 3). When there is a Z-axis angular velocity input from outside, under the action of the Coriolis force, the proof mass will vibrate on a detection axis (Y-axis in FIG. 3) at the same time. There is a linear relationship between the vibration amplitude and the angular velocity, and the current angular velocity can be calculated by detecting the vibration amplitude of the proof mass on the detection axis.

Manufacturing process defects in micromachining can lead to a non-ideal structure in the gyroscope. Thus, in actual operation, the proof mass does not vibrate strictly on the drive axis in the drive mode. The actual vibration direction may have a small angular deviation from the drive axis. This deviation will cause the vibration of the drive axis to couple directly to the detection axis, such that the gyroscope will still have a detection signal output even when the angular velocity input is zero. This phenomenon is called a quadrature error.

The quadrature error signal of the gyroscope is easily affected by stress and deformation. However, since the quadrature error signal and the detection signal have a 90° phase difference, it can be prevented from being demodulated during the demodulation process to avoid its change from affecting the normal output result of the gyroscope. Therefore, the influence of the external force on the gyroscope can be reflected and quantified by demodulating the quadrature error signal.

Figure 4:
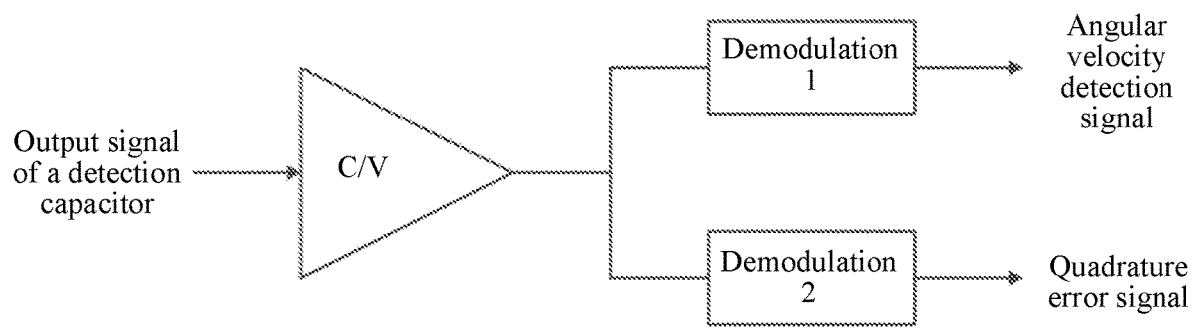
FIG. 4 is a flowchart of processing an output signal of a gyroscope according to an embodiment of the present disclosure.

FIG. 4 shows a flowchart of processing an output signal of the gyroscope according to the embodiment. A signal output by a detection capacitor is converted by C/V, and an angular velocity detection signal for characterizing the angular velocity and a quadrature error signal are demodulated, respectively.

As previously mentioned, the quadrature error is caused by the non-ideal structure produced by the manufacturing process defect of the micromachining, which is determined by the micromechanical structure. When the gyroscope is in a normal state, the quadrature error signal will not change regardless of whether there is an angular velocity input.

However, when the gyroscope is subjected to an external force to cause stress and deformation, the quadrature error signal will change greatly. Although the stress and deformation will act on the angular velocity detection signal and the quadrature error signal of the gyroscope at the same time, the influence on the quadrature error signal is much greater than that on the angular velocity detection signal. In an actual experiment, the change of the quadrature error signal and the change of the angular velocity detection signal under the strain state were compared for gyroscopes with different structural designs. The experiment found that the change caused by the quadrature error signal was about 10-20 times larger than that caused by the angular velocity detection signal. For the same structural design, the ratio of the change of the quadrature error signal to the change of the angular velocity detection signal is basically fixed. It can be seen that, compared with the angular velocity detection signal, the quadrature error signal has a higher sensitivity to the external force. Thus, as long as the external force is controlled within an appropriate range, the gyroscope can be used to detect external forces without affecting its normal function (angular velocity detection).

In this embodiment, when the wearer does not speak, the stress states at the sensing positions 111 and 112 basically do not change. The quadrature error signal of the gyroscope 140 is basically unchanged, and the quadrature error signal of the gyroscope 140 is not affected regardless of whether there is an angular velocity input. When the wearer speaks, bone conduction vibrations are created in the wall of the ear canal and the bone conduction vibrations are sensed at the sensing positions 111 and 112. The bone conduction vibrations are conducted to the gyroscope 140 through the transmission bars 131 and 132. Under the action of the bone conduction vibrations, the stress state of the gyroscope 140 is constantly changing, and the strain state caused by the external force is also constantly changing. When the strain state changes, the quadrature error signal of the gyroscope 140 correspondingly fluctuates. As mentioned earlier, the quadrature error signal is affected by the strain change approximately 10 to 20 times more than the angular velocity detection signal. The strain of the gyroscope 140 caused by the bone conduction vibrations can be sensitively reflected by the quadrature error signal of the gyroscope. The influence on the angular velocity detection signal is easy to control within an acceptable range that is relatively small.

To transmit the bone conduction vibrations to the gyroscope 140, the transmission bars 131 and 132 are preferably made of a rigid material and may also be made of an elastic material suitable for transmitting the bone conduction vibrations to the gyroscope 140 and making the gyroscope 140 strain.

In this embodiment, the transmission bars 131 and 132 act on one end of the gyroscope 140 and are fixedly connected to the gyroscope 140. However, based on the principle that the gyroscope 140 senses the bone conduction vibrations, a non-fixed connection may be used. For example, the transmission bars 131 and 132 may act on one end of the gyroscope 140 and abut against the gyroscope 140 to realize vibration conduction. In actual assembly, the transmission bars 131 and 132 may not completely fit against the gyroscope 140. However, if vibration conduction can be achieved (acting on or intermittently acting on the gyroscope 140 during the conduction vibration), even a small gap is acceptable.

Figure 5:
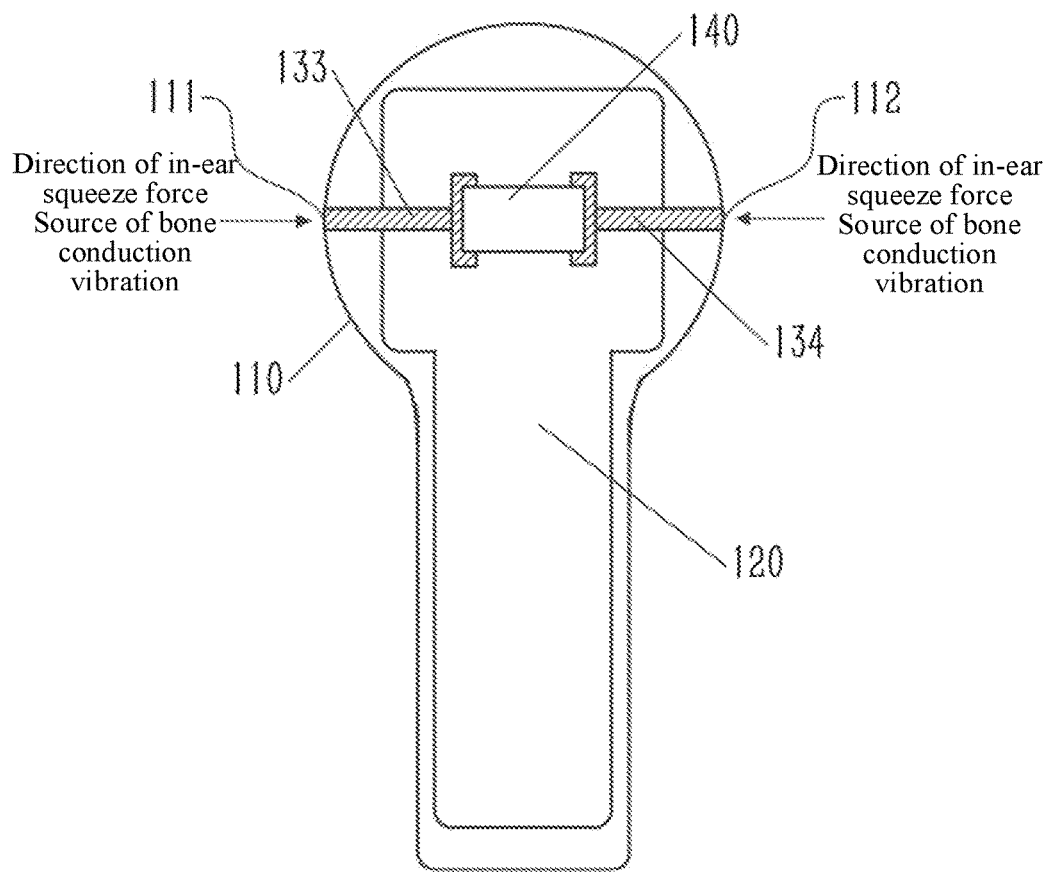
FIG. 5 is a structural diagram of an optional transmission bar according to an embodiment of the present disclosure.

FIG. 5 shows an alternative transmission bar configuration. One end of each of transmission bars 133 and 134 acting on the gyroscope 140 is configured as a concave structure matching the shape of the gyroscope 140. The concave structure does not need to be fixedly connected to the gyroscope 140 and can also achieve stable position limiting.

Figure 6:
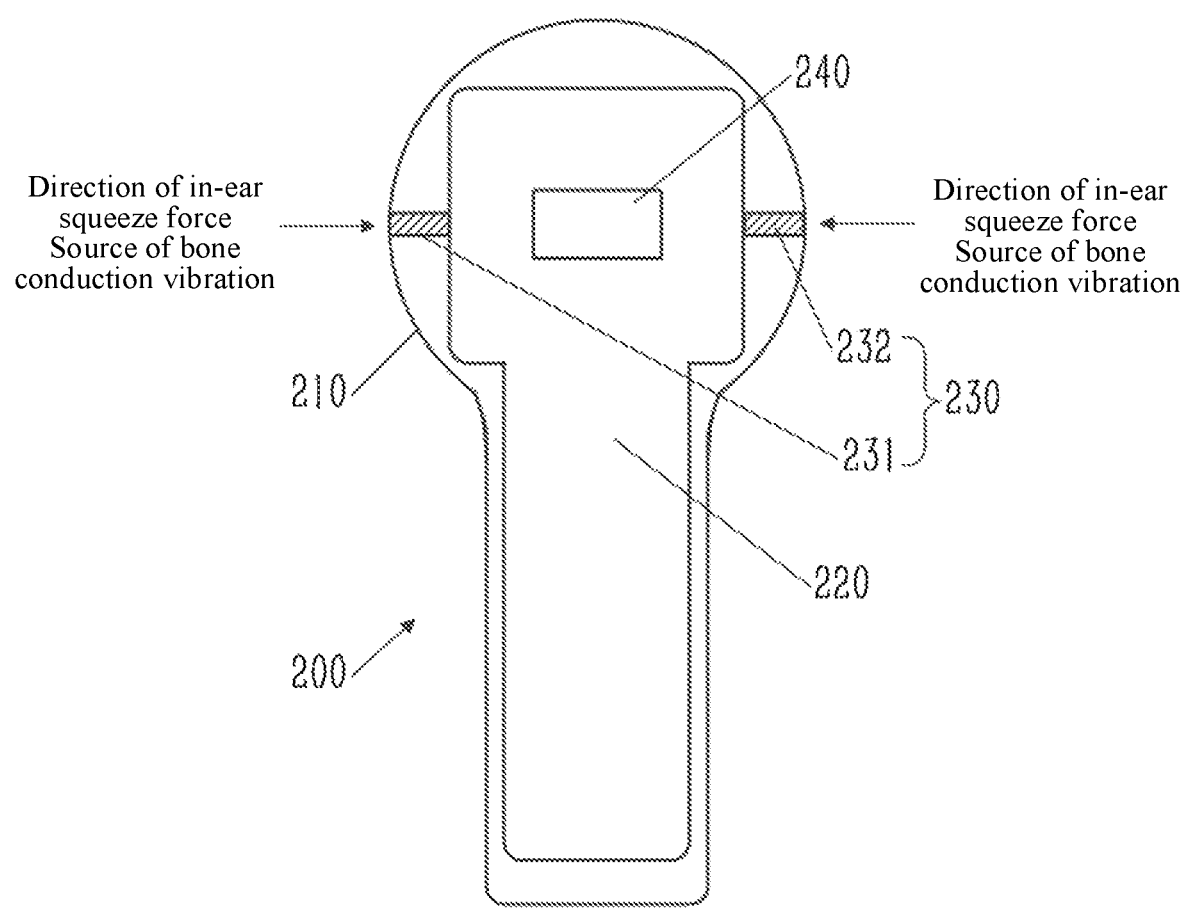
FIG. 6 is an internal structural diagram of a headphone according to another embodiment of the present disclosure.
Figure 7:
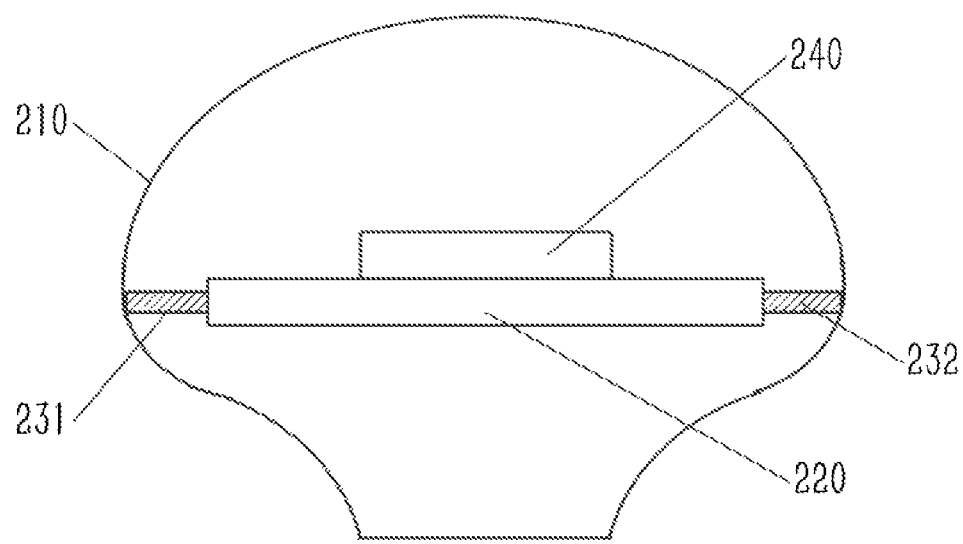
FIG. 7 is an internal structural diagram of the headphone shown in FIG. 6 in a top view.

FIGS. 6 and 7 are structural diagrams according to another embodiment of the present disclosure. A headphone 200 includes a shell 210, a PCB 220, a transmission assembly 230, and a gyroscope 240.

The PCB 220 is fixedly provided in the shell 210, and the gyroscope 240 is fixed on the PCB 220. The transmission assembly 230 includes transmission bars 231 and 232. The transmission bars 231 and 232 are made of the same material and have the same structure.

Different from the structure shown in FIG. 1, in this embodiment, the transmission bars 231 and 232 are symmetrically arranged on two sides of the PCB 220. As shown in FIG. 6, extension lines of the transmission bars 231 and 232 pass through the gyroscope 240. The transmission bar 231 has one end fixed to an inner side of the shell 210 and the other end connected to the PCB 220. The transmission bar 232 has one end symmetrical with the transmission bar 231 and fixed to the other inner side of the shell 210 and the other end connected to the PCB 220. The methods of connecting the transmission bars 231 and 232 to the PCB 220 include but are not limited to, fixed connection by welding, gluing, etc., and plug connection realized by matching grooves provided on the PCB 220 and the transmission bars 231 and 232. Of course, the transmission bars 231 and 232 may also abut against the PCB 220 or have an acceptable gap, which is not limited herein.

In this embodiment, the transmission bars 231 and 232 transmit the bone conduction vibrations to the PCB 220. The PCB 220 generates a strain, thereby driving the gyroscope 240 to strain. In this way, bone conduction vibration sensing is achieved through the gyroscope 240. Specifically, the bone conduction vibrations are reflected by the quadrature error signal of the gyroscope 240.

For the connection or cooperation (non-fixed connection) method of the transmission assembly 230 and the gyroscope 240, the selection of the material of the transmission assembly 230, the selection of the connection positions of the transmission assembly 230 and the shell 210, and the sensing positions defined by the connection positions, reference can be made to the above embodiments, which will not be repeated herein.

Figure 8:
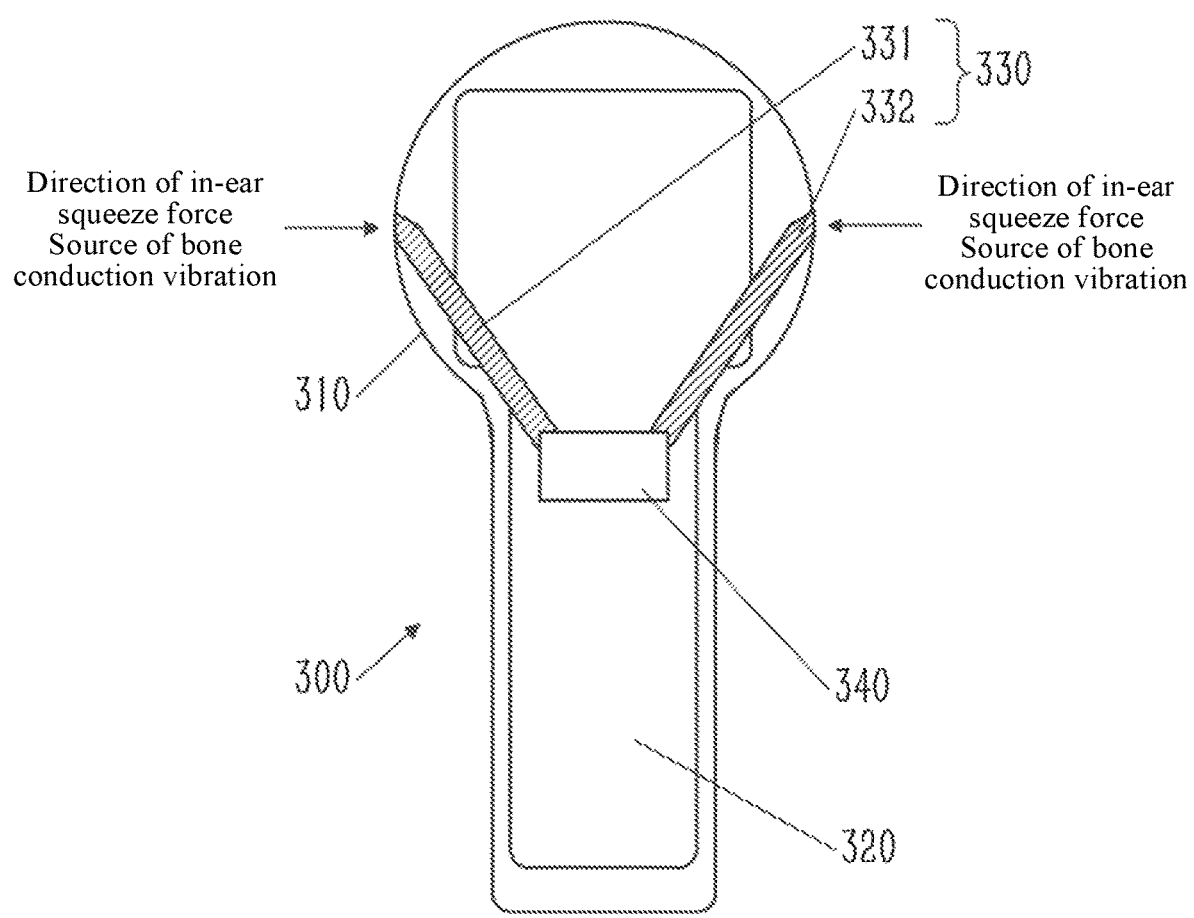
FIG. 8 is an internal structural diagram of a headphone according to another embodiment of the present disclosure.

FIG. 8 is a structural diagram according to another preferred embodiment of the present disclosure. A headphone 300 includes a shell 310, a PCB 320, a transmission assembly 330, and a gyroscope 340.

The PCB 320 is fixedly provided in the shell 310, and the gyroscope 340 is fixed on the PCB 320. The transmission assembly 330 includes transmission bars 331 and 332. The transmission bars 331 and 332 are made of the same material and have the same structure.

In this embodiment, the gyroscope 340 is provided in the shell 310 and at a central part of the headphone 300. The transmission bars 331 and 332 are symmetrically arranged on two sides of the gyroscope 340. The transmission bar 331 has one end fixed to one inner side of the shell 310 and the other end connected to the gyroscope 340. The transmission bar 332 has one end symmetrical with the one end of the transmission bar 331 and fixed to the other inner side of the shell 310 and the other end connected to the gyroscope 340.

Different from the structure shown in FIG. 1, in this embodiment, since the position of the gyroscope 340 is moved downward, the transmission bars 331 and 332 are not in the same extending direction but are at an angle with respect to the gyroscope 340. Likewise, the bone conduction vibrations are transmitted to the gyroscope 340 through the transmission bars 331 and 332 to make the gyroscope strain, such that bone conduction vibration sensing is realized through the gyroscope 340. Specifically, the bone conduction vibrations are reflected by the quadrature error signal of the gyroscope 340.

For the connection or cooperation (non-fixed connection) method of the transmission assembly 330 and the gyroscope 340, the selection of the material of the transmission assembly 330, the selection of the connection positions of the transmission assembly 330 and the shell 310, and the sensing positions defined by the connection positions, reference can be made to the above embodiments, which will not be repeated herein.

Figure 9:
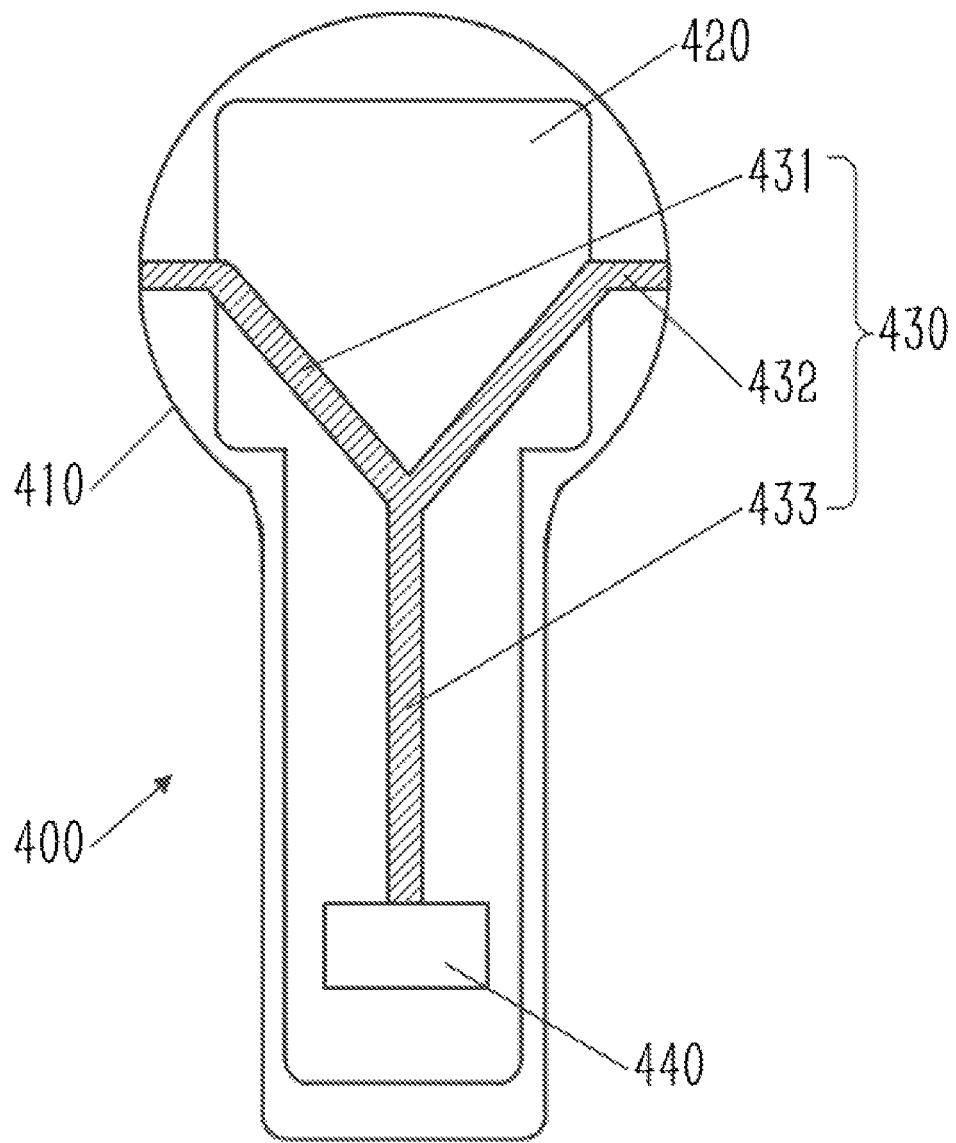
FIG. 9 is an internal structural diagram of a headphone according to another embodiment of the present disclosure.

FIG. 9 is a structural diagram according to another embodiment of the present disclosure. A headphone 400 includes a shell 410, a PCB 420, a transmission assembly 430, and a gyroscope 440.

The PCB 420 is fixedly provided in the shell 410, and the gyroscope 440 is fixed on the PCB 420. The transmission assembly 430 includes a transmission section 431, a transmission section 432, and a transmission section 433. The transmission section 431, the transmission section 432, and the transmission section 433 are integrally formed.

In this embodiment, the gyroscope 440 is provided in the shell 410 and at a lower part of the headphone 400. The transmission section 431 and the transmission section 432 are arranged symmetrically. The transmission section 433 extends along an axis of symmetry of the transmission section 431 and the transmission section 432. One end of each of the three sections is connected at one place to form a Y-shaped structure. The other end of the transmission section 431 is fixed on one inner side of the shell 410, the other end of the transmission section 432 is symmetrical with the transmission section 431 and fixed on the other inner side of the shell 410, and the other end of the transmission section 433 is connected to the gyroscope 440.

For the connection or cooperation (non-fixed connection) method of the transmission section 433 and the gyroscope 440, the selection of the material of the transmission assembly 430, the selection of the connection positions of the transmission assembly 430 and the shell 410, and the sensing positions defined by the connection positions, reference can be made to the above embodiments, which will not be repeated herein.

When the wearer is speaking, bone conduction vibrations on the wall of the ear canal act on the sensing positions (the sensing positions in this embodiment are the same as the sensing positions 111 and 112 shown in FIG. 1). The transmission sections 431 and 432 transmit the bone conduction vibrations to the transmission section 433. The transmission section 433 then transmits the bone conduction vibrations to the gyroscope 440. In this way, bone conduction vibration sensing is achieved through the gyroscope 440. Specifically, the bone conduction vibrations are reflected by the quadrature error signal of the gyroscope 440.

In all the above embodiments, the gyroscope is provided in the headphone. In other embodiments, the headphone is provided with an IMU, and the gyroscope is included in the IMU. Correspondingly, the same technical effect can also be achieved by replacing the gyroscope in all the above embodiments with the IMU.

In all the above embodiments, the transmission assembly has a symmetrical structure. This is because the gyroscope or IMU is located at a central axis, and the transmission assembly with the symmetrical structure facilitates the manufacture of each component (reduces the types of component manufacture). Regardless of whether the gyroscope or IMU is provided at the central axis or is provided away from the central axis, the asymmetrical structure of the transmission assembly will not affect the gyroscope's bone conduction vibration sensing, as long as the transmission assembly can play the role of conducting vibration.

The processing and utilization of the quadrature error signal of the gyroscope can be implemented in a circuit manner and/or by a processor. For example, if the headphone is connected to an electronic device, such as an audio playback device, a mobile phone, an augmented reality (AR) device, or a virtual reality (VR) device, or is used as an integral part of the electronic device, the processing and utilization of the quadrature error signal can be completed by the processor in the electronic device. The specific implementation is not limited herein.

In the above solution, the gyroscope can be used to sense the external force, such as the bone conduction vibration, and reflect the received external force through the quadrature error signal. Based on this, in the above solution, the quadrature error signal provided by the gyroscope can be used for data and audio processing or as a necessary means to realize functions, including but not limited to user interface (UI) gesture detection, voice activity detection, voice recognition, active noise control, noise suppression, and voice intelligibility enhancement, etc.

For example, when the headphone in the above embodiments detects the bone conduction vibrations from the wearer, it can be determined that the headphone wearer is speaking, which will facilitate some functional improvements. When the headphone wearer uses a voice, such as "Hi, Siri" to wake up the mobile phone, the gyroscope senses the bone conduction vibrations, and the quadrature error signal generated by the gyroscope changes accordingly. These signals are picked up by the mobile phone connected to the headphone. The mobile phone determines that the wearer of the headphone is speaking according to the signal and deems that the voice that wakes up the mobile phone is sent by the wearer of the headphone. If no bone conduction vibrations are detected, the quadrature error signal has little or no change, it is considered that the voice that wakes up the mobile phone is not provided by the wearer of the headphone, so the mobile phone cannot be woken up.

For another example, when a call is answered, when bone conduction vibrations from the headphone wearer are detected, it is determined that the headphone wearer is speaking, and the audio signal detected by a microphone is conducted to a receiving party. When no bone conduction vibrations are detected, it is determined that the headphone wearer is not speaking. In this case, the audio signal detected by the microphone is regarded as ambient noise, and there is no need to transmit the microphone signal to the receiving party, thereby improving voice recognition and call quality.

The above description is intended to illustrate that the quadrature error signal of the gyroscope in the above solution can be used for many functions to improve existing functions or generate new functions but is not intended to limit the scope of application.

The above described are the preferred specific embodiments of the present disclosure. It should be understood that a person of ordinary skill in the art can make various modifications and variations according to the concept of the present disclosure without creative efforts. Therefore, all technical solutions that a person skilled in the art can obtain based on the prior art through logical analysis, reasoning, or finite experiments according to the concept of the present disclosure shall fall within the protection scope defined by the appended claims.

What is claimed is:

1. A headphone, comprising a gyroscope and a transmission assembly, the gyroscope senses a bone conduction vibration and provides a quadrature error signal for reflecting the bone conduction vibration; the transmission assembly acts directly or indirectly on the gyroscope or an inertial measurement unit (IMU) comprising the gyroscope, the transmission assembly has at least one end fixed to a shell of the headphone and at least one end connected to, abutting against, or spaced a certain distance from the gyroscope or the IMU comprising the gyroscope, the transmission assembly transmits the bone conduction vibration to the gyroscope to make the gyroscope strain, thereby causing the quadrature error signal of the gyroscope to change.

2. The headphone according to claim 1, wherein the transmission assembly has a symmetrical structure.

3. The headphone according to claim 1, wherein the transmission assembly comprises a first transmission component and a second transmission component, which are respectively arranged on two sides of the gyroscope; the first transmission component has one end fixed to a shell of the headphone and the other end connected to, abutting against, or spaced a certain distance from the gyroscope or the IMU comprising the gyroscope; and the second transmission component has one end fixed to the shell of the headphone and the other end connected to, abutting against, or spaced a certain distance from the gyroscope or the IMU comprising the gyroscope.

4. The headphone according to claim 1, wherein the transmission assembly comprises a first end, a second end, and a third end; the first end and the second end are separately fixed to a shell of the headphone; and the third end is connected to, abuts against, or is spaced a certain distance from the gyroscope or the IMU comprising the gyroscope.

5. The headphone according to claim 1, wherein the transmission assembly is made of a rigid material, or is made of an elastic material suitable for transmitting the bone conduction vibration to the gyroscope or the IMU comprising the gyroscope and making the gyroscope strain.

6. The headphone according to claim 1, wherein the gyroscope or the IMU comprising the gyroscope is fixed to a base plate; and the transmission assembly directly acts on the base plate, thereby indirectly acting on the gyroscope or the IMU comprising the gyroscope through the base plate.

7. The headphone according to claim 1, wherein a connection position of the transmission assembly and the shell of the headphone defines a sensing zone, which is located at a position suitable for sensing the bone conduction vibration when the headphone is worn.

8. An electronic device, comprising the headphone according to claim 1.

9. The electronic device according to claim 8, wherein the quadrature error signal of the gyroscope is used for a user interface (UI) gesture detection, a voice activity detection, a voice recognition, an active noise control, a noise suppression, and a voice intelligibility enhancement.

10. The electronic device according to claim 8, wherein in the headphone, the transmission assembly has a symmetrical structure.

11. The electronic device according to claim 8, wherein in the headphone, the transmission assembly comprises a first transmission component and a second transmission component, which are respectively arranged on two sides of the gyroscope; the first transmission component has one end fixed to a shell of the headphone and the other end connected to, abutting against, or spaced a certain distance from the gyroscope or the IMU comprising the gyroscope;

and the second transmission component has one end fixed to the shell of the headphone and the other end connected to, abutting against, or spaced a certain distance from the gyroscope or the IMU comprising the gyroscope.

12. The electronic device according to claim 8, wherein in the headphone, the transmission assembly comprises a first end, a second end, and a third end; the first end and the second end are separately fixed to a shell of the headphone; and the third end is connected to, abuts against, or is spaced a certain distance from the gyroscope or the IMU comprising the gyroscope.

13. The electronic device according to claim 8, wherein in the headphone, the transmission assembly is made of a rigid material, or is made of an elastic material suitable for transmitting the bone conduction vibration to the gyroscope or the IMU comprising the gyroscope and making the gyroscope strain.

14. The electronic device according to claim 8, wherein in the headphone, the gyroscope or the IMU comprising the gyroscope is fixed to a base plate; and the transmission assembly directly acts on the base plate, thereby indirectly acting on the gyroscope or the IMU comprising the gyroscope through the base plate.

15. The electronic device according to claim 8, wherein in the headphone, a connection position of the transmission assembly and the shell of the headphone defines a sensing zone, which is located at a position suitable for sensing the bone conduction vibration when the headphone is worn.

\* \* \* \* \*